United States Patent
Nongpiur et al.

(10) Patent No.: US 8,543,390 B2
(45) Date of Patent: Sep. 24, 2013

(54) MULTI-CHANNEL PERIODIC SIGNAL ENHANCEMENT SYSTEM

(75) Inventors: Rajeev Nongpiur, Burnaby (CA); Phillip Hetherington, Moody (CA)

(73) Assignee: QNX Software Systems Limited, Kanata, Ontario (CA)

( * ) Notice: Subject to any disclaimer, the term of this patent is extended or adjusted under 35 U.S.C. 154(b) by 1409 days.

(21) Appl. No.: 11/849,009

(22) Filed: Aug. 31, 2007

(65) Prior Publication Data

US 2008/0019537 A1 Jan. 24, 2008

Related U.S. Application Data

(63) Continuation-in-part of application No. 10/973,575, filed on Oct. 26, 2004, now Pat. No. 7,680,652.

(51) Int. Cl.
*G10L 21/02* (2006.01)

(52) U.S. Cl.
USPC ......... 704/226; 704/200; 704/200.1; 704/201

(58) Field of Classification Search
USPC .................................. 704/200–201, 226–227
See application file for complete search history.

(56) References Cited

U.S. PATENT DOCUMENTS

| | | |
|---|---|---|
| 4,238,746 A | 12/1980 | McCool et al. |
| 4,282,405 A | 8/1981 | Taguchi |
| 4,468,804 A | 8/1984 | Kates et al. |
| 4,486,900 A | 12/1984 | Cox et al. |
| 4,531,228 A | 7/1985 | Noso et al. |
| 4,628,156 A | 12/1986 | Irvin |
| 4,630,305 A | 12/1986 | Borth et al. |
| 4,731,846 A | 3/1988 | Secrest et al. |
| 4,791,390 A * | 12/1988 | Harris et al. ................... 333/166 |
| 4,811,404 A | 3/1989 | Vilmur et al. |
| 4,843,562 A | 6/1989 | Kenyon et al. |
| 4,939,685 A | 7/1990 | Feintuch |
| 4,969,192 A | 11/1990 | Chen |
| 5,027,410 A | 6/1991 | Williamson et al. |
| 5,056,150 A | 10/1991 | Yu et al. |
| 5,146,539 A | 9/1992 | Doddington et al. |
| 5,278,780 A | 1/1994 | Eguchi et al. |

(Continued)

FOREIGN PATENT DOCUMENTS

| | | |
|---|---|---|
| CA | 2158847 | 9/1994 |
| CA | 2157496 | 10/1994 |

(Continued)

OTHER PUBLICATIONS

Tam, et al., "Highly Oversampled Subband Adaptive Filters for Noise Cancellation on a Low-resource DSP System," Proc. of Int. Conf. on Spoken Language Processing (ICSLP), Sep. 2002, pp. 1-4.

(Continued)

*Primary Examiner* — Douglas Godbold
(74) *Attorney, Agent, or Firm* — Brinks Hofer Gilson & Lione

(57) ABSTRACT

A multi-channel signal enhancement system reinforces signal content and improves the signal-to-noise ratio of a multi-channel signal. The system detects, tracks, and reinforces non-stationary periodic signal components of a multi-channel signal. The periodic signal components of the signal may represent vowel sounds or other voiced sounds. The system may detect, track, or attenuate quasi-stationary signal components in the multi-channel signal.

25 Claims, 13 Drawing Sheets

(56) References Cited

U.S. PATENT DOCUMENTS

| | | | |
|---|---|---|---|
| 5,313,555 A | 5/1994 | Kamiya | |
| 5,377,276 A | 12/1994 | Terai et al. | |
| 5,400,409 A * | 3/1995 | Linhard | 381/92 |
| 5,406,622 A | 4/1995 | Silverberg et al. | |
| 5,408,581 A | 4/1995 | Suzuki et al. | |
| 5,412,735 A | 5/1995 | Engebretson et al. | |
| 5,432,859 A | 7/1995 | Yang et al. | |
| 5,459,813 A | 10/1995 | Klayman | |
| 5,473,702 A | 12/1995 | Yoshida et al. | |
| 5,479,517 A | 12/1995 | Linhard | |
| 5,494,886 A | 2/1996 | Kehne et al. | |
| 5,495,415 A | 2/1996 | Ribbens et al. | |
| 5,502,688 A | 3/1996 | Recchione et al. | |
| 5,526,466 A | 6/1996 | Takizawa | |
| 5,530,768 A | 6/1996 | Yoshizumi | |
| 5,568,559 A | 10/1996 | Makino | |
| 5,572,262 A | 11/1996 | Ghosh | |
| 5,584,295 A | 12/1996 | Muller et al. | |
| 5,590,241 A * | 12/1996 | Park et al. | 704/227 |
| 5,602,962 A * | 2/1997 | Kellermann | 704/226 |
| 5,615,298 A | 3/1997 | Chen | |
| 5,617,508 A | 4/1997 | Reaves | |
| 5,641,931 A | 6/1997 | Ogai et al. | |
| 5,677,987 A | 10/1997 | Seki et al. | |
| 5,680,508 A | 10/1997 | Liu | |
| 5,692,104 A | 11/1997 | Chow et al. | |
| 5,697,084 A | 12/1997 | Tingley | |
| 5,701,344 A | 12/1997 | Wakui | |
| 5,714,997 A | 2/1998 | Anderson | |
| 5,737,719 A | 4/1998 | Terry | |
| 5,742,694 A | 4/1998 | Eatwell | |
| 5,819,215 A | 10/1998 | Dobson | |
| 5,845,243 A | 12/1998 | Smart | |
| 5,864,798 A | 1/1999 | Miseki et al. | |
| 5,920,840 A | 7/1999 | Satyamurti | |
| 5,920,848 A | 7/1999 | Schutzer et al. | |
| 5,933,801 A | 8/1999 | Fink et al. | |
| 5,949,886 A | 9/1999 | Nevins et al. | |
| 5,949,888 A | 9/1999 | Gupta et al. | |
| 5,953,694 A | 9/1999 | Pillekamp | |
| 6,011,853 A | 1/2000 | Koski et al. | |
| 6,084,907 A | 7/2000 | Nagano | |
| 6,104,992 A | 8/2000 | Gao et al. | |
| 6,111,957 A | 8/2000 | Thomasson | |
| 6,144,336 A | 11/2000 | Preston et al. | |
| 6,163,608 A | 12/2000 | Romesburg et al. | |
| 6,167,375 A | 12/2000 | Miseki et al. | |
| 6,173,074 B1 | 1/2001 | Russo | |
| 6,175,602 B1 | 1/2001 | Gustafson et al. | |
| 6,188,979 B1 | 2/2001 | Ashley | |
| 6,192,134 B1 | 2/2001 | White et al. | |
| 6,199,035 B1 | 3/2001 | Lakaniemi et al. | |
| 6,219,418 B1 | 4/2001 | Eriksson et al. | |
| 6,249,275 B1 | 6/2001 | Kodama | |
| 6,282,430 B1 | 8/2001 | Young | |
| 6,285,979 B1 | 9/2001 | Ginzburg et al. | |
| 6,397,262 B1 | 5/2002 | Hayden et al. | |
| 6,405,168 B1 | 6/2002 | Bayya et al. | |
| 6,408,273 B1 | 6/2002 | Quagliaro et al. | |
| 6,434,246 B1 | 8/2002 | Kates et al. | |
| 6,473,409 B1 | 10/2002 | Malvar | |
| 6,493,338 B1 | 12/2002 | Preston et al. | |
| 6,498,811 B1 | 12/2002 | Van Der Vleuten | |
| 6,507,814 B1 | 1/2003 | Gao | |
| 6,587,816 B1 | 7/2003 | Chazan | |
| 6,594,367 B1 * | 7/2003 | Marash et al. | 381/92 |
| 6,628,781 B1 | 9/2003 | Grundström et al. | |
| 6,633,894 B1 | 10/2003 | Cole | |
| 6,643,619 B1 | 11/2003 | Linhard et al. | |
| 6,687,669 B1 | 2/2004 | Schrögmeier et al. | |
| 6,690,681 B1 | 2/2004 | Preston et al. | |
| 6,725,190 B1 | 4/2004 | Chazan et al. | |
| 6,732,073 B1 | 5/2004 | Kluender et al. | |
| 6,771,629 B1 | 8/2004 | Preston et al. | |
| 6,782,363 B2 | 8/2004 | Lee et al. | |
| 6,804,640 B1 | 10/2004 | Weintraub et al. | |
| 6,822,507 B2 | 11/2004 | Buchele | |
| 6,836,761 B1 | 12/2004 | Kawashima et al. | |
| 6,859,420 B1 | 2/2005 | Coney et al. | |
| 6,871,176 B2 | 3/2005 | Choi et al. | |
| 6,885,752 B1 | 4/2005 | Chabries et al. | |
| 6,891,809 B1 | 5/2005 | Ciccone et al. | |
| 6,898,293 B2 | 5/2005 | Kaulberg | |
| 6,910,011 B1 | 6/2005 | Zakarauskas | |
| 6,937,978 B2 | 8/2005 | Liu | |
| 7,003,099 B1 * | 2/2006 | Zhang et al. | 379/406.03 |
| 7,020,291 B2 * | 3/2006 | Buck et al. | 381/92 |
| 7,117,149 B1 | 10/2006 | Zakarauskas | |
| 7,146,012 B1 * | 12/2006 | Belt et al. | 381/92 |
| 7,146,316 B2 * | 12/2006 | Alves | 704/233 |
| 7,167,516 B1 | 1/2007 | He | |
| 7,167,568 B2 | 1/2007 | Malvar et al. | |
| 7,174,022 B1 * | 2/2007 | Zhang et al. | 381/92 |
| 7,206,418 B2 | 4/2007 | Yang et al. | |
| 7,206,421 B1 * | 4/2007 | Taenzer | 381/119 |
| 7,231,347 B2 | 6/2007 | Zakarauskas | |
| 7,269,188 B2 | 9/2007 | Smith | |
| 7,272,566 B2 | 9/2007 | Vinton | |
| 7,657,038 B2 * | 2/2010 | Doclo et al. | 381/94.1 |
| 2001/0005822 A1 | 6/2001 | Fujii et al. | |
| 2001/0028713 A1 | 10/2001 | Walker | |
| 2002/0052736 A1 | 5/2002 | Kim et al. | |
| 2002/0071573 A1 | 6/2002 | Finn | |
| 2002/0176589 A1 * | 11/2002 | Buck et al. | 381/94.7 |
| 2003/0040908 A1 * | 2/2003 | Yang et al. | 704/233 |
| 2003/0093265 A1 | 5/2003 | Xu et al. | |
| 2003/0093270 A1 | 5/2003 | Domer | |
| 2003/0097257 A1 | 5/2003 | Amada et al. | |
| 2003/0101048 A1 | 5/2003 | Liu | |
| 2003/0206640 A1 | 11/2003 | Malvar et al. | |
| 2003/0216907 A1 | 11/2003 | Thomas | |
| 2003/0228023 A1 * | 12/2003 | Burnett et al. | 381/92 |
| 2004/0002856 A1 | 1/2004 | Bhaskar et al. | |
| 2004/0024600 A1 | 2/2004 | Hamza et al. | |
| 2004/0071284 A1 | 4/2004 | Abutalebi et al. | |
| 2004/0078200 A1 | 4/2004 | Alves | |
| 2004/0138882 A1 | 7/2004 | Miyazawa | |
| 2004/0165736 A1 | 8/2004 | Hetherington et al. | |
| 2004/0167777 A1 | 8/2004 | Hetherington et al. | |
| 2004/0179610 A1 | 9/2004 | Lu et al. | |
| 2005/0047611 A1 * | 3/2005 | Mao | 381/94.7 |
| 2005/0075866 A1 | 4/2005 | Widrow | |
| 2005/0111683 A1 | 5/2005 | Chabries et al. | |
| 2005/0114128 A1 | 5/2005 | Hetherington et al. | |
| 2005/0240401 A1 | 10/2005 | Ebenezer | |
| 2006/0015331 A1 * | 1/2006 | Hui et al. | 704/227 |
| 2006/0034447 A1 | 2/2006 | Alves et al. | |
| 2006/0056502 A1 | 3/2006 | Callicotte | |
| 2006/0074646 A1 | 4/2006 | Alves et al. | |
| 2006/0089958 A1 | 4/2006 | Geisbrecht et al. | |
| 2006/0089959 A1 | 4/2006 | Nongpiur et al. | |
| 2006/0100868 A1 | 5/2006 | Hetherington et al. | |
| 2006/0115095 A1 | 6/2006 | Giesbrecht et al. | |
| 2006/0116873 A1 | 6/2006 | Hetherington et al. | |
| 2006/0154623 A1 * | 7/2006 | Chen et al. | 455/116 |
| 2006/0222184 A1 * | 10/2006 | Buck et al. | 381/71.1 |
| 2006/0251268 A1 | 11/2006 | Hetherington et al. | |
| 2006/0287859 A1 | 12/2006 | Hetherington et al. | |
| 2007/0033031 A1 | 2/2007 | Zakarauskas | |
| 2007/0136055 A1 | 6/2007 | Hetherington | |
| 2007/0223497 A1 * | 9/2007 | Elson et al. | 370/400 |
| 2008/0001951 A1 * | 1/2008 | Marks et al. | 345/474 |
| 2008/0069366 A1 * | 3/2008 | Soulodre | 381/63 |
| 2008/0159507 A1 * | 7/2008 | Virolainen et al. | 379/202.01 |
| 2008/0165993 A1 * | 7/2008 | Cho | 381/307 |
| 2008/0288219 A1 * | 11/2008 | Tashev et al. | 702/190 |
| 2009/0164212 A1 * | 6/2009 | Chan et al. | 704/226 |
| 2009/0202091 A1 * | 8/2009 | Pedersen et al. | 381/313 |

FOREIGN PATENT DOCUMENTS

| | | |
|---|---|---|
| CA | 2158064 | 10/1994 |
| EP | 0 076 687 A1 | 4/1983 |
| EP | 0 275 416 | 7/1988 |
| EP | 0 558 312 A1 | 9/1993 |

| | | |
|---|---|---|
| EP | 0 629 996 A2 | 12/1994 |
| EP | 0 629 996 A3 | 12/1994 |
| EP | 0 750 291 A1 | 12/1996 |
| EP | 0 948 237 A2 | 10/1999 |
| EP | 1 450 353 A1 | 8/2004 |
| EP | 1 450 354 A1 | 8/2004 |
| EP | 1 669 983 A1 | 6/2006 |
| JP | 06269084 A2 | 9/1994 |
| JP | 06319193 A | 11/1994 |
| WO | WO 0041169 A1 | 7/2000 |
| WO | WO 0156255 A1 | 8/2001 |
| WO | WO 0173761 A1 | 10/2001 |
| WO | WO 2006/130668 A2 | 12/2006 |

OTHER PUBLICATIONS

Avendano, C., Hermansky, H., 'Study on the Dereverberation of Speech Based on Temporal envelope Filtering, Proc. ICSLP '96, pp. 889-892, Oct. 1996.

Nakatani, T., Miyoshi, M., and Kinoshita, K., "Implementation and Effects of Single Channel Dereverberation Based on the Harmonic Structure of Speech," Proc. of IWAENC-2003, pp. 91-94, Sep. 2003.

Fiori, S., Uncini, A., and Piazza, F., "Blind Deconvolution by Modified Bussgang Algorithm", Dept. of Electronics and Automatics—University of Ancona (Italy), ISCAS 1999.

Vieira, J., "Automatic Estimation of Reverberation Time," Audio EngineeringSociety, Convention Paper 6107, 116$^{th}$ Convention, May 8-11, 2004, Berlin, Germany, pp. 1-7.

Pornimitkul, Pradya Et Al., 2102797 Statistic Digital Signal Processing, Comparison of NLMS and RLS for Acoustic Echo Cancellation (AEC) and White Gaussian Noise (WGN), Department of Electrical Engineering Faculty of Engineering, 2002, pp. 1-19.

Bilcu, et al., "A New Variable Length LMS Algorithm: Theoretical Analysis and Implementations", 2002 IEEE, pp. 1031-1034.

Nascimento, Vitor H., "Improving the Initial Convergence of Adaptive Filters Variable-Length LMS Algorithms", 2002 IEEE, pp. 667-670.

Ismo Kauppinen, "Methods for Detecting Impulsive Noise in Speech and Audio Signals", pp. 967-970, IEEE 2002.

Saeed V. Vaseghi and Peter J.W. Rayner, "The Effects of Non-Stationary Signal Characteristics on the Performance of Adaptive Audio Restoration System", pp. 377-380, IEEE 1989.

Anderson C.M., et al: "Adaptive Enhancement of Finite Bandwidth Signals in White Gaussian Noise", IEEE Trans. on Acoustics, Speech and Signal Processing, vol. ASSP-31, No. 1, Feb. 1983, pp. 17-28.

Chang J.H., et al: "Pitch Estimation of Speech Signal Based on Adaptive Lattice Notch Filter", Signal Processing, Elsevier Science Publishers B.V. Amsterdam, NL, vol. 85, No. 3, Mar. 2005, pp. 637-641.

Rabiner L.R., et al: "A Comparative Performance Study of Several Pitch Detection Algorithms", IEEE Trans. on Acoustics, Speech and Signal Processing, vol. ASSP-24, No. 5, Oct. 1976, pp. 399-418.

Byun K.J., et al: "Noise Whitening-Based Pitch Detection for Speech Highly Corrupted by Colored Noise", ETRI Journal, vol. 25, No. 1, Feb. 2003, pp. 49-51.

Campbell D.A., et al: "Dynamic Weight Leakage for LMS Adaptive Linear Predictors", Tencon '96 Proceedings, 1996 IEEE Tencon Digital Signal Processing Applications Perth, WW, Australia Nov. 26-29, 1996, NY, NY, USA, IEEE, US, vol. 2, Nov. 26, 1996, pp. 574-579.

Sasaoka N, et al: "A New Noise Reduction System Based on ALE and Noise Reconstruction Filter", Circuits and Systems, 2005. ISCAS 2005. IEEE International Symposium on KOBE, Japan May 23-26, 2005, Piscataway, NJ USA, IEEE May 23, 2005, pp. 272-275.

Learned, R.E. et al., A Wavelet Packet Approach to Transient Signal Classification, Applied and Computational Harmonic Analysis, Jul. 1995, pp. 265-278, vol. 2, No. 3, USA, XP 000972660. ISSN: 1063-5203. abstract.

Quatieri, T.F. et al., Noise Reduction Using a Soft-Decision Sine-Wave Vector Quantizer, International Conference on Acoustics, Speech & Signal Processing, Apr. 3, 1990, pp. 821-824, vol. Conf. 15, IEEE ICASSP, New York, US XP000146895, Abstract, Paragraph 3.1.

Quelavoine, R. et al., Transients Recognition in Underwater Acoustic with Multilayer Neural Networks, Engineering Benefits from Neural Networks, Proceedings of the International Conference EANN 1998, Gibraltar, Jun. 10-12, 1998 pp. 330-333, XP 000974500. 1998, Turku, Finland, Syst. Eng. Assoc., Finland. ISBN: 951-97868-0-5. abstract, p. 30 paragraph 1.

Simon, G., Detection of Harmonic Burst Signals, International Journal Circuit Theory and Applications, Jul. 1985, vol. 13, No. 3, pp. 195-201, UK, XP 000974305. ISSN: 0098-9886. abstract.

Zakarauskas, P., Detection and Localization of Nondeterministic Transients in Time series and Application to Ice-Cracking Sound, Digital Signal Processing, 1993, vol. 3, No. 1, pp. 36-45, Academic Press, Orlando, FL, USA, XP 000361270, ISSN: 1051-2004. entire document.

Widrow, B. et al., "Adaptive Noise Cancelling: Principles and Applications" 1975, IEEE, vol. 63, No. 13, New York, pp. 1692-1716.

Kang, Hae-Dong; "Voice Enhancement Using a Single Input Adaptive Noise Elimination Technique Having a Recursive Time-Delay Estimator", Kyungbook National University (Korea), Doctoral Thesis, Dec. 31, 1993, pp. 11-26.

Berk et al., "Data Analysis with Microsoft Excel", Duxbury Press, 1998, pp. 236-239 and 256-259.

Puder, H. et al., "Improved Noise Reduction for Hands-Free Car Phones Utilizing Information on a Vehicle and Engine Speeds", Sep. 4-8, 2000, pp. 1851-1854, vol. 3, XP009030255, 2000. Tampere, Finland, Tampere Univ. Technology, Finland Abstract.

Seely, S., "An Introduction to Engineering Systems", Pergamon Press Inc., 1972, pp. 7-10.

Shust, Michael R. and Rogers, James C., Abstract of "Active Removal of Wind Noise From Outdoor Microphones Using Local Velocity Measurements", J. Acoust. Soc. Am., vol. 104, No. 3, Pt 2, 1998, 1 page.

Shust, Michael R. and Rogers, James C., "Electronic Removal of Outdoor Microphone Wind Noise", obtained from the Internet on Oct. 5, 2006 at: <http://www.acoustics.org/press/136th/mshust.htm>, 6 pages.

Wahab, A. et al., "Intelligent Dashboard With Speech Enhancement", Information, Communications, and Signal Processing, 1997. ICICS, Proceedings of 1997 International Conference on Singapore, Sep. 9-12, 1997, New York, NY, USA, IEEE, pp. 993-997.

The prosecution history of U.S. Appl. No. 10/973,575, printed Dec. 30, 2008, including any substantive Office Actions and Applicant Responses.

The prosecution history of U.S. Appl. No. 11/101,796, printed Dec. 12, 2008, including any substantive Office Actions and Applicant Responses.

The prosecution history of U.S. Appl. No. 11/102,251, printed Dec. 12, 2008, including any substantive Office Actions and Applicant Responses.

The prosecution history of U.S. Appl. No. 11/298,052, printed Dec. 30, 2008, including any substantive Office Actions and Applicant Responses.

The prosecution history of U.S. Appl. No. 11/317,762, printed Jan. 6, 2009, including any substantive Office Actions and Applicant Responses.

The prosecution history of U.S. Appl. No. 11/757,768, printed Jan. 6, 2009, including any substantive Office Actions and Applicant Responses.

Koike, Shiin'ichi, "Adaptive Threshold Nonlinear Algorithm for Adaptive Filters with Robustness Against Impulse Noise," 1996, IEEE, NEC Corporation, Tokyo 108-01, pp. 1644-1647.

Gui, Y. et al., "Adaptive Subband Wiener Filtering for Speech Enhancement Using Critical-Band Gammatone Filterbank," IEEE, 2005, pp. 732-735.

Office Action dated Nov. 26, 2012 from corresponding Canadian Application No. 2 516 881, 7 pages.

Office Action dated Jul. 13, 2009 from corresponding Canadian Application No. 2 571 417, 4 pages.

Office Action dated Jun. 19, 2012 from corresponding Canadian Application No. 2 571 417, 2 pages.

Office Action dated Jul. 28, 2011 from corresponding Canadian Application No. 2 569 223, 3 pages.

* cited by examiner

MULTI-CHANNEL PERIODIC SIGNAL ENHANCEMENT SYSTEM

PRIORITY CLAIM

This application is a continuation-in-part of and claims the benefit of priority from U.S. application Ser. No. 10/973,575, filed Oct. 26, 2004, which is incorporated by reference.

BACKGROUND OF THE INVENTION

1. Technical Field

This disclosure relates to signal processing systems, and in particular to a system that enhances periodic signal components.

2. Related Art

Audio signal processing systems may capture sound, reproduce sound, and convey sound. Audio systems may be susceptible to noise that can corrupt, mask, or otherwise affect signal content. Wind, rain, background noise, such as engine noise, electromagnetic interference, and other noise sources may contribute noise to a signal captured, reproduced, or conveyed to other systems. When the noise level of sound increases, intelligibility of the signal may decrease.

Some systems may attempt to minimize noise by detecting sound through multiple microphones. The signals from each microphone may be combined to limit the noise. Other systems may use noise filters to selectively attenuate sound. The noise filters may indiscriminately eliminate or minimize desired signal content. Therefore, there is a need for a system that enhances signals.

SUMMARY

A multi-channel periodic signal enhancement system reinforces signal content and improves the signal-to-noise ratio of a multi-channel signal. The system detects, tracks, and reinforces non-stationary periodic signal components of a multi-channel signal. The periodic signal components of the signal may represent vowel sounds or other voiced sounds. The system may detect, track, or attenuate quasi-stationary signal components in the multi-channel signal.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like-referenced numerals designate corresponding parts throughout the different views.

FIG. 12 is a multi-channel periodic signal enhancement system with.

DETAILED DESCRIPTION OF THE PREFERRED EMBODIMENTS

The signal enhancement system detects and tracks one or more fundamental frequency components in a signal. The system may reinforce tracked frequency components. The system may improve the intelligibility of a speech signal or other audio signals. The reinforced signal may have an improved signal-to-noise ratio (SNR).

Figure 1:
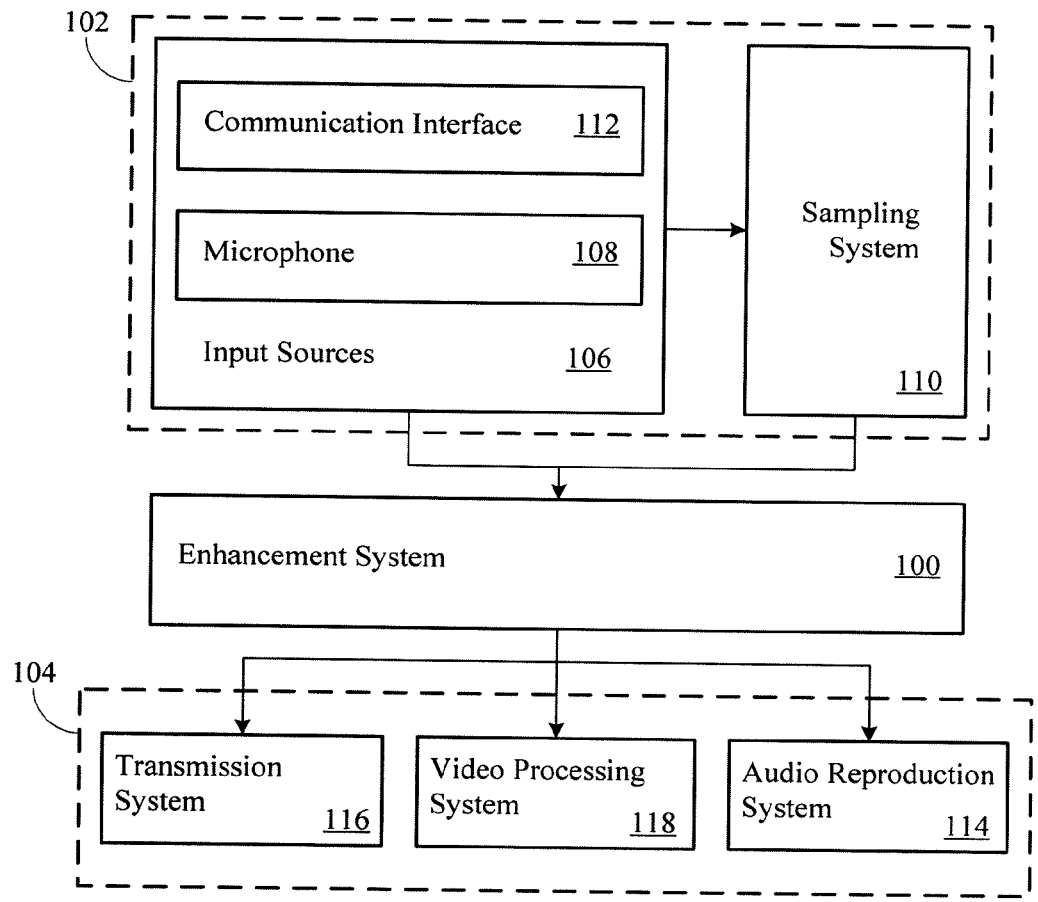
FIG. 1 is a signal enhancement system with preprocessing and post-processing logic.

In FIG. 1, a signal enhancement system 100 operates with preprocessing logic 102 and post-processing logic 104. The enhancement system 100 may be implemented in hardware and/or software. The enhancement system 100 may include a digital signal processor (DSP). The DSP may execute instructions that delay an input signal, track frequency components of a signal, filter a signal and/or reinforce spectral content in a signal. Alternatively, the enhancement system 100 may include discrete logic or circuitry, a mix of discrete logic and a processor, or may be distributed over multiple processors or programs.

The enhancement system 100 may accept input from the input sources 106. The input sources 106 may include digital signal sources or analog signal sources, such as a microphone 108. The microphone 108 may be connected to the enhancement system 100 through a sampling system 110. The sampling system 110 may convert analog signals from the microphone 108 into digital form at a selected sampling rate.

The sampling rate may be selected to capture any desired frequency content. For speech, the sampling rate may be approximately 8 kHz to about 22 kHz. For music, the sampling rate may be approximately 22 Hz to about 44 kHz. Other sampling rates may be used for speech and/or music.

The digital signal sources may include a communication interface 112, other circuitry or logic in the system in which the enhancement system 100 is implemented, or other signal sources. When the input source is a digital signal source, the signal enhancement system 100 may accept the digital signal samples with or without additional preprocessing.

The signal enhancement system 100 may also connect to post-processing logic 104. The post-processing logic 104 may include an audio reproduction system 114, a digital and/or analog data transmission system 116, or video processing logic 118. Other post-processing logic also may be used.

The audio reproduction system 114 may include digital to analog converters, filters, amplifiers, and other circuitry or logic. The audio reproduction system 114 may include a speech and/or music reproduction system. The audio reproduction system 114 may be implemented in a cellular telephone, wireless telephone, digital media player/recorder, radio, stereo, portable gaming device, or other devices employing sound reproduction.

The video processing system 118 may include circuitry and/or logic that provides a visual output. The signal used to prepare the visual output may be enhanced by the processing performed by the enhancement system 100. The video processing system 118 may control a television or other entertainment device. Alternatively, the video processing system 118 may control a computer monitor or liquid crystal display (LCD).

The transmission system 116 may provide a network connection, digital or analog transmitter, or other transmission circuitry and/or logic. The transmission system 116 may communicate enhanced signals generated by the enhancement system 100 to other devices. In a car phone, for example, the transmission system 116 may communicate enhanced signals from the car phone to a base station or other receiver through a wireless connection such as a ZigBee, Mobile-Fi, Ultrawideband, Wi-fi, or a WiMax protocol.

Figure 2:
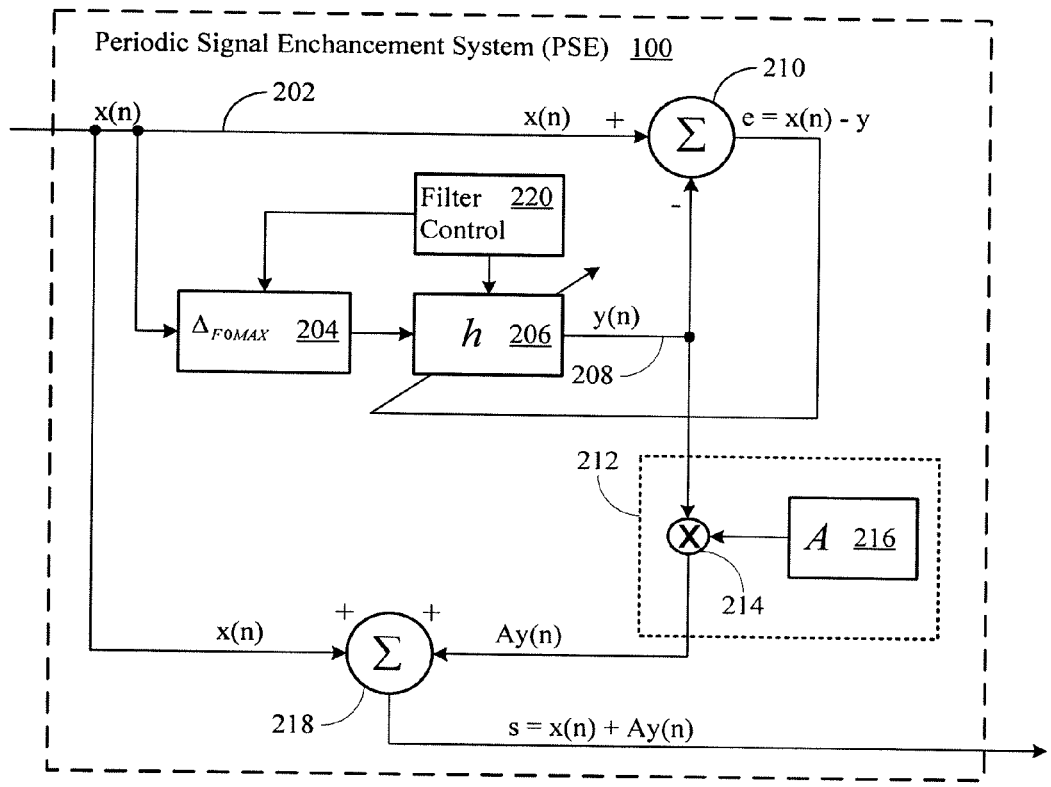
FIG. 2 is a single stage signal enhancement system.

FIG. 2 is an enhancement system 100, also referred to as a periodic enhancement system. The enhancement system 100 may include a signal input 202 labeled as x(n) or x, where the index n may represent the sample number. The input signal x(n) may be time domain samples of speech. However, the enhancement system 100 may enhance signals with a different frequency range, whether audible or not.

The enhancement system 100 may process quasi-stationary or non-stationary signals. Non-stationary signals may vary in frequency and/or amplitude relatively quickly over time. Voice is one example of a non-stationary signal.

With few exceptions, even the fundamental frequency component in a speaker's voice changes during speech. The change in fundamental frequency may vary by as much as approximately 50 percent per about 100 ms or more. To the human ear, however, the speaker's voice may have a relatively constant pitch.

Quasi-stationary signals may change in frequency and/or amplitude less frequently than non-stationary signals. Quasi-stationary signals may arise from machine noise, a controlled human voice, or from other sources. Slowly changing engine noise or alternator whine are examples of quasi-stationary signals.

In FIG. 2, the input signal is coupled to delay logic 204. The delay logic 204 may impart a delay to the input signal. The delay may vary depending on the particular implementation of the enhancement system 100. The delay may correspond to a period of a selected maximum pitch. The maximum pitch may be equal to the greatest pitch in the input signal that the enhancement system 100 enhances. The maximum pitch may vary widely depending on the type and characteristics of the input signal.

Speech signals may include a fundamental frequency component from approximately 70 Hz to about 400 Hz. Male speech may include a fundamental frequency component between approximately 70 Hz to about 200 Hz. Female speech may include a fundamental frequency component between approximately 200 Hz to about 400 Hz. A child's speech may include a fundamental frequency component between approximately 250 Hz to about 400 Hz.

The enhancement system 100 may process input signals that include speech from both male and female voices, either separately or simultaneously and overlapping. In such systems, the maximum pitch period may correspond approximately to the period of the fundamental frequency of the female voice. The maximum pitch period may be approximately about 1/300 Hz (approximately 3.3 ms), or may be another pitch period associated with female voice.

Alternatively, the enhancement system 100 may process male speech. In such systems, the maximum pitch period may correspond to the period of the fundamental frequency of a male voice. The maximum pitch period may be approximately 1/150 Hz (approximately 6.6 ms), or may be another pitch period.

The delay logic 204 may delay the input signal by the number of signal samples corresponding to the maximum pitch period. The number of signal samples may be given by:

$$NSS = MPP * f_s$$

where NSS is the number of signal samples, MPP is the maximum pitch period and $f_s$ is the sampling rate. Assuming an MPP of about 3.3 ms and a sampling rate of about 8 kHz, NSS=approximately 27 samples. In FIG. 2, NSS corresponds to the delay logic $\Delta_{F0MAX}$ 204.

The delayed input signal may be received by the filter 206. The filter 206 may include a filter output 208 that carries a filtered output signal, labeled y(n) or y. The filter 206 may track one or more frequency components in the input signal based on the delayed input signal. The filter 206 may track the fundamental frequencies in the input signal as the pitch changes during voiced speech.

The filter 206 may reproduce, replicate, approximate, or otherwise include the tracked frequency content in the filtered output signal. The filter 206 may be a finite impulse response filter (FIR) or other type of digital filter. The filter coefficients may be adaptive. The filter 206 may be adapted by a normalized least mean squares (NLMS) technique or other type of adaptive filtering technique, such as recursive least squares (RLS) or proportional LMS. Other tracking logic, including other filters, may also be used.

The filter 206 may converge to the fundamental frequency in the input signal. The range of fundamental frequencies $f_o$ over which the filter 206 converges may be given by the following equations:

$$f_o = f_{0\text{Max}} - f_{0\text{Min}}$$

$$f_{0\text{MAX}} = \frac{f_s}{\Delta_{F0MAX}}$$

$$f_{0\text{MIN}} = \frac{f_s}{\Delta_{F0MAX} + L}$$

where $\Delta_{F0MAX}$ is the period for the maximum pitch (expressed in terms of samples), $f_s$ is the sampling frequency (in units of Hz), and L is the length of the filter 206 (in units of samples). The filter length L may increase or decrease to increase or decrease the frequency extent over which the filter 206 tracks frequency components.

In the example above, the maximum pitch was approximately 300 Hz, and the delay logic 204 may use a 27 sample delay. A filter length L of 64 samples may yield a filter 206 that tracks fundamental frequency content over a frequency range of approximately 88 Hz to about 296 Hz as follows:

$$f_{0\text{MAX}} = \frac{8000}{27} \approx 296$$

$$f_{0\text{MIN}} = \frac{8000}{27 + 64} \approx 88$$

$$f_o \approx 296 - 88 = 208 \text{ Hz}$$

The filter 206 may adapt over time. The filter 206 may adapt by evaluating an error signal "e" on a sample-by-sample basis. Alternatively, the filter 206 may adapt based on blocks of samples, or some other basis. In adapting, the filter 206 may change one or more of its filter coefficients. The filter coefficients may change the response of the filter 206. The filter coefficients may adapt the filter 206 so that the filter 206 may minimize the error signal "e".

The error estimator 210 may generate the error signal e. The error estimator 210 may be an adder, comparator, or other circuitry or logic. The error estimator 210 may compare the input signal "x" with the filtered output signal "y."

As the filter 206 converges to the fundamental frequency in the input signal, the error signal may decrease. As the error signal decreases, the filtered output signal y may more closely resemble the input signal x delayed by an integer multiple of the signal's fundamental frequencies. The gain control logic 212 may respond to the error signal.

The optional gain control logic 212 may include a multiplier 214 and a gain parameter 216. The gain control logic 212 may attenuate, amplify, or otherwise modify the filtered output signal. FIG. 2 shows that the gain control logic 212 may apply a gain "A" to the filtered output signal to produce the gain controlled signal "Ay."

The reinforcement logic 218 may reinforce frequency content in the input signal x with the gain controlled signal Ay. The reinforcement logic 218 may be an adder or other circuitry and/or logic. The reinforcement logic 218 may produce the enhanced output signal according to the equation below:

$$s = x + Ay$$

When the error signal e increases, the gain control logic 212 may reduce the gain A. When the gain is reduced, the filtered output signal may contribute less to the enhanced output signal. The relationship between the error signal e and the gain A may be continuous, or may resemble a stepped function, a linear function, or may be discontinuous or non-linear.

In one implementation, the enhancement system 100 may establish one or more error thresholds. As the error signal exceeds an upper threshold, the gain control logic 212 may reduce the gain A to about zero. The upper threshold may be set to the input signal so that if e>x, then the gain A may be set to about zero. As the error signal falls below a lower threshold, the gain control logic 212 may increase the gain A to a value of about one.

When the error signal e exceeds the upper threshold, the filter control logic 220 may reset the filter 206. When the filter 206 is reset, the control logic 220 may reset the filter coefficients to about a value of zero, may re-initialize the filter coefficients, or may take other actions. The control logic 220 may dynamically modify the filter length, may modify the delay implemented by the delay logic 204, or may modify other characteristics of the enhancement system 100. The control logic 220 may modify the enhancement system 100 to adapt to changing environments in which the enhancement system is used, to adapt the enhancement system 100 to a new speaker, or to other applications.

The filter control logic 220 may control how quickly the filter 206 adapts, or may monitor or control other filter characteristics. The control logic 220 may expect quickly changing frequency and amplitude components in the input signal. The control logic 220 may also expect or determine over time that particular frequency components in the input signal are prevalent.

The control logic 220 may determine that the input signal x has changed in frequency content, amplitude, or other characteristics from what is expected or from what has been determined. In response, the control logic 220 may stop the filter 206 from adapting to the new signal content, may slow the rate of adaptation, or may take other actions. The control logic 220 may exercise control over the filter 206 until the input signal characteristics return to an expected signal, until a predetermined time has elapsed, until instructed to release control, or until another time or condition is met.

The delay logic 204 may prevent the filtered output signal from precisely duplicating the current input signal x. Thus, the filtered output signal may closely track the selected periodicities in the input signal x. When the current input signal x is reinforced by the filtered output signal y to produce the output signal s, periodic signal components may combine constructively, and random noise components may combine destructively. Therefore, the periodic signal components may be enhanced more than the noise.

The delay introduced by the delay logic 204 and the filter 206 may be approximately one cycle of a fundamental frequency component tracked by the filter 206. The delay may correspond to the glottal pulse delay for voice sounds, such as vowels. When the filtered output signal is added to the input signal, the delay may allow the fundamental frequency components to add in-phase or approximately in-phase.

When added in-phase, the resulting gain in the fundamental frequency content in the enhanced output signal may be approximately 6 dB or more. The noise in the input signal and the filtered output signal may be out of phase. When the input signal and the filtered output signal are added, the noise may increase less than the enhanced frequency content, for example by 3 dB or less. The enhanced output signal may have an increased signal-to-noise ratio.

The input signal x that the enhancement system 100 processes may include multiple fundamental frequencies. For example, when two speakers are speaking at the same time, the input signal may include two non-stationary fundamental frequencies. When multiple fundamental frequencies are present, the filter 206 may adapt and converge to provide a filtered out signal y, which may be a delayed version of the input signal. The reinforcement logic 218 may reinforce one or more of the fundamental frequencies present in the input signal.

Figure 3:
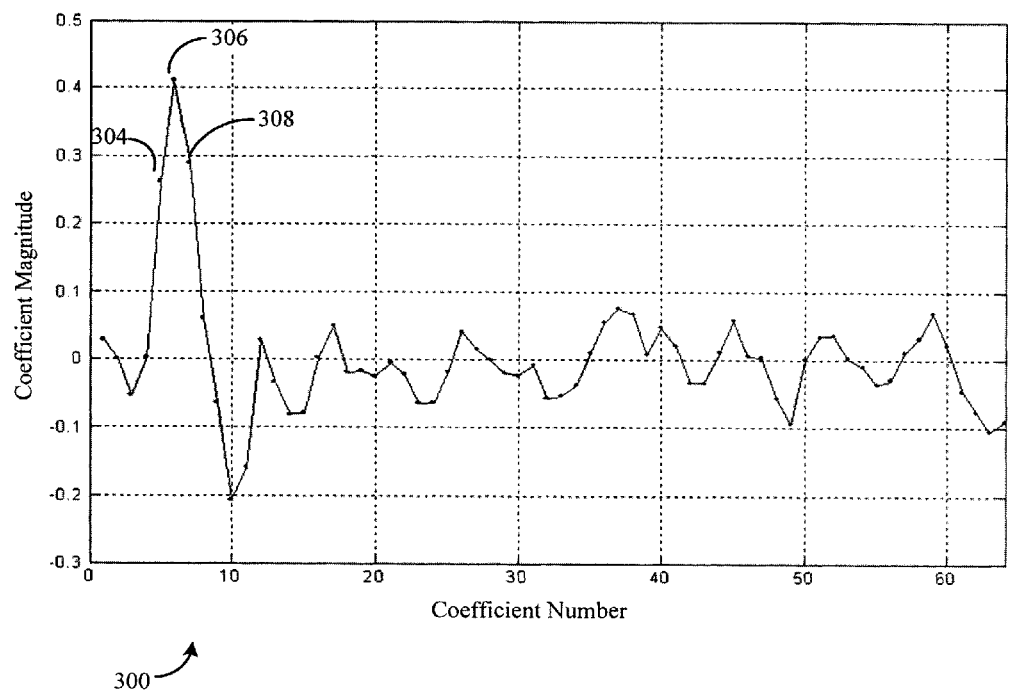
FIG. 3 is a plot of filter coefficients in a filter adapted to a female voice.

FIG. 3 is a plot that illustrates coefficients 300 for the filter 206. The coefficients are plotted by coefficient number on the horizontal axis and by magnitude on the vertical axis. The coefficients 300 may show that the filter 206 has adapted to female speech.

At any instant in time, the coefficients 300 may be analyzed to determine a fast estimate of the fundamental frequencies in the input signal, with good temporal resolution. The coefficients 300 may begin to peak at about coefficient 304 (the fifth filter coefficient), coefficient 306 (the sixth filter coefficient), and coefficient 308 (the seventh filter coefficient). By searching for a coefficient peak or an approximate coefficient peak and determining a corresponding coefficient index c, a fast approximation of the fundamental frequency $f_a$ may be made where:

$$f_a = \frac{f_s}{(c + \Delta_{F0MAX})}$$

In FIG. 3, the coefficient peak is at the sixth filter coefficient 306. Assuming an approximate 8 kHz sampling rate and a 27 sample delay:

$$f_a = \frac{f_s}{(c + \Delta_{F0MAX})} = \frac{8000}{6 + 27} \approx 242 \text{ Hz}$$

Figure 4:
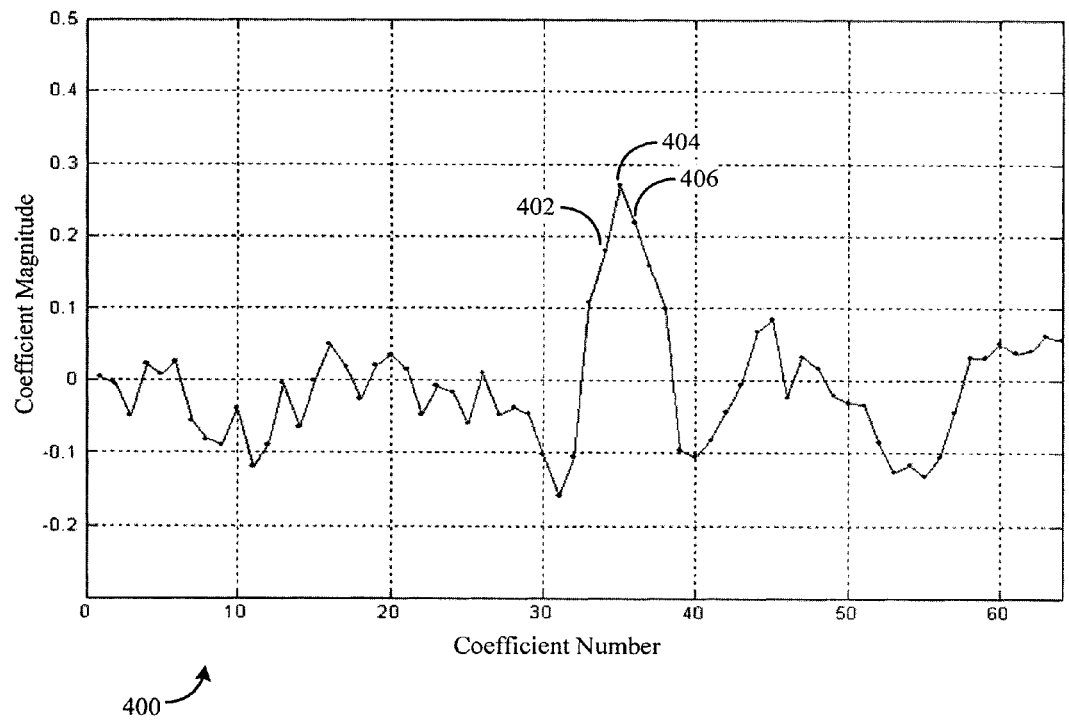
FIG. 4 is a plot of filter coefficients in a filter adapted to a male voice.

FIG. 4 is a plot showing coefficients 400 for the filter 206 that may have adapted to male speech. The coefficient peak appears near coefficient 402 (the 34th filter coefficient), coefficient 404 (the 35th filter coefficient), and coefficient 406 (the 36th filter coefficient). An approximation to the fundamental frequency is:

$$f_a = \frac{f_s}{(c + \Delta_{F0MAX})} = \frac{8000}{35 + 27} \approx 129 \text{ Hz}$$

The control logic 220 may store historical data on many characteristics of the input signal, including the fundamental frequency of the input signal as it changes over time. The control logic 220 may examine the historical data as an aid in determining whether the characteristics of the input signal have unexpectedly changed. The control logic 220 may respond by exercising adaptation control over the filter 206 or by taking other actions.

Figure 5:
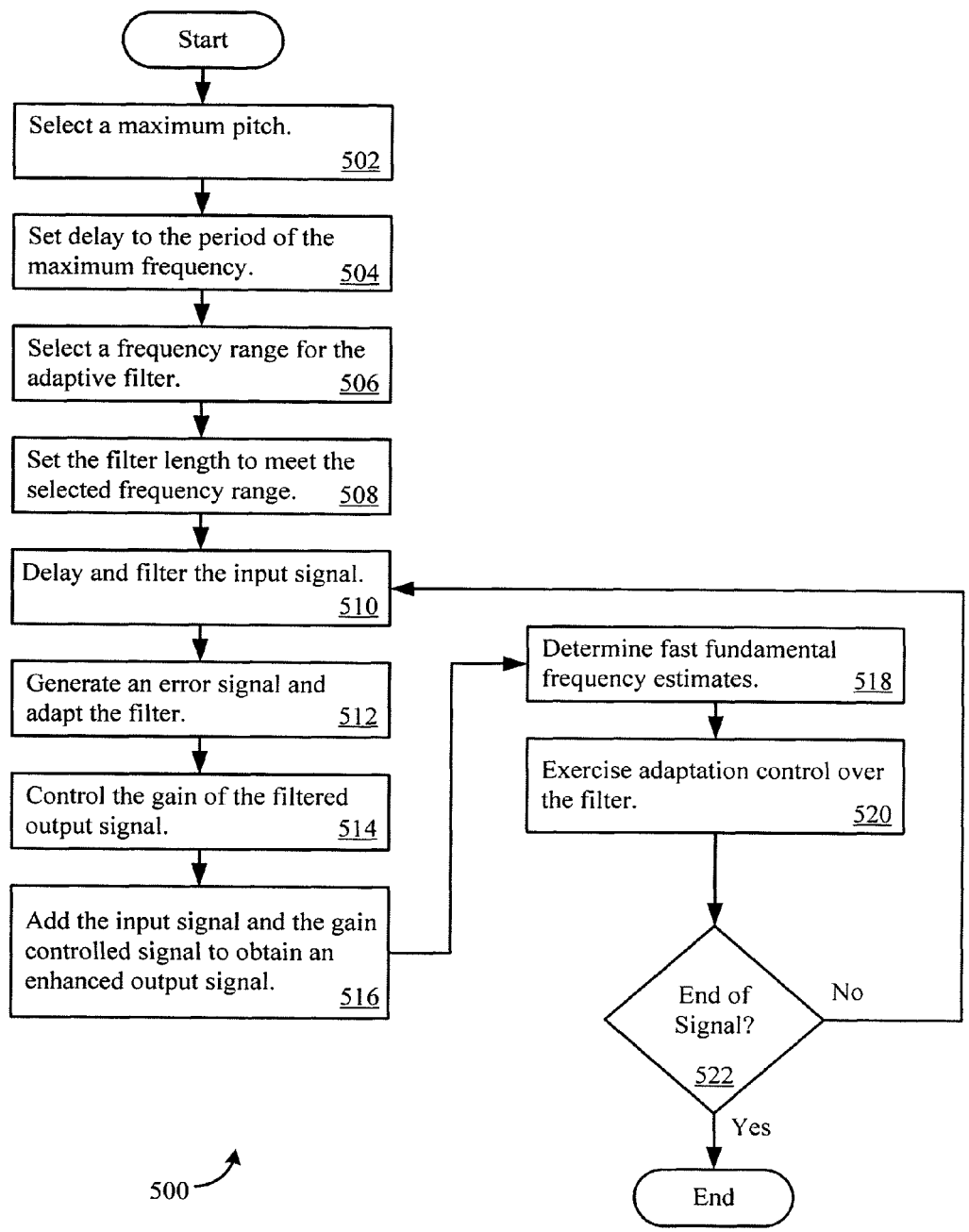
FIG. 5 is a flow diagram for signal enhancement.

FIG. 5 is flow diagram showing acts that may be taken to enhance a periodic signal. A maximum pitch may be selected for processing by the enhancement system 100 (Act 502). The delay logic 204 may be set to implement the period of the maximum pitch (Act 504). A frequency range over which the enhancement system 100 will operate may also be selected (Act 506). The filter length of the filter 205 may be set to accommodate the frequency range (Act 508). The filter length may be dynamically changed during the filter 206 operation.

The input signal may be delayed and filtered (Act 510). The enhancement system 100 may generate an error signal and may adapt the filter 206 (Act 512). The enhancement system 100 may control the gain of the filtered output signal (Act 514). The enhancement system 100 may add the input signal and the gain controlled signal (Act 516) to produce an enhanced output signal. The enhancement system 100 also may determine fundamental frequency estimates (Act 518). The enhancement system 100 may employ the frequency estimates to exercise adaptation control over the filter 206 (Act 520).

Figure 6:
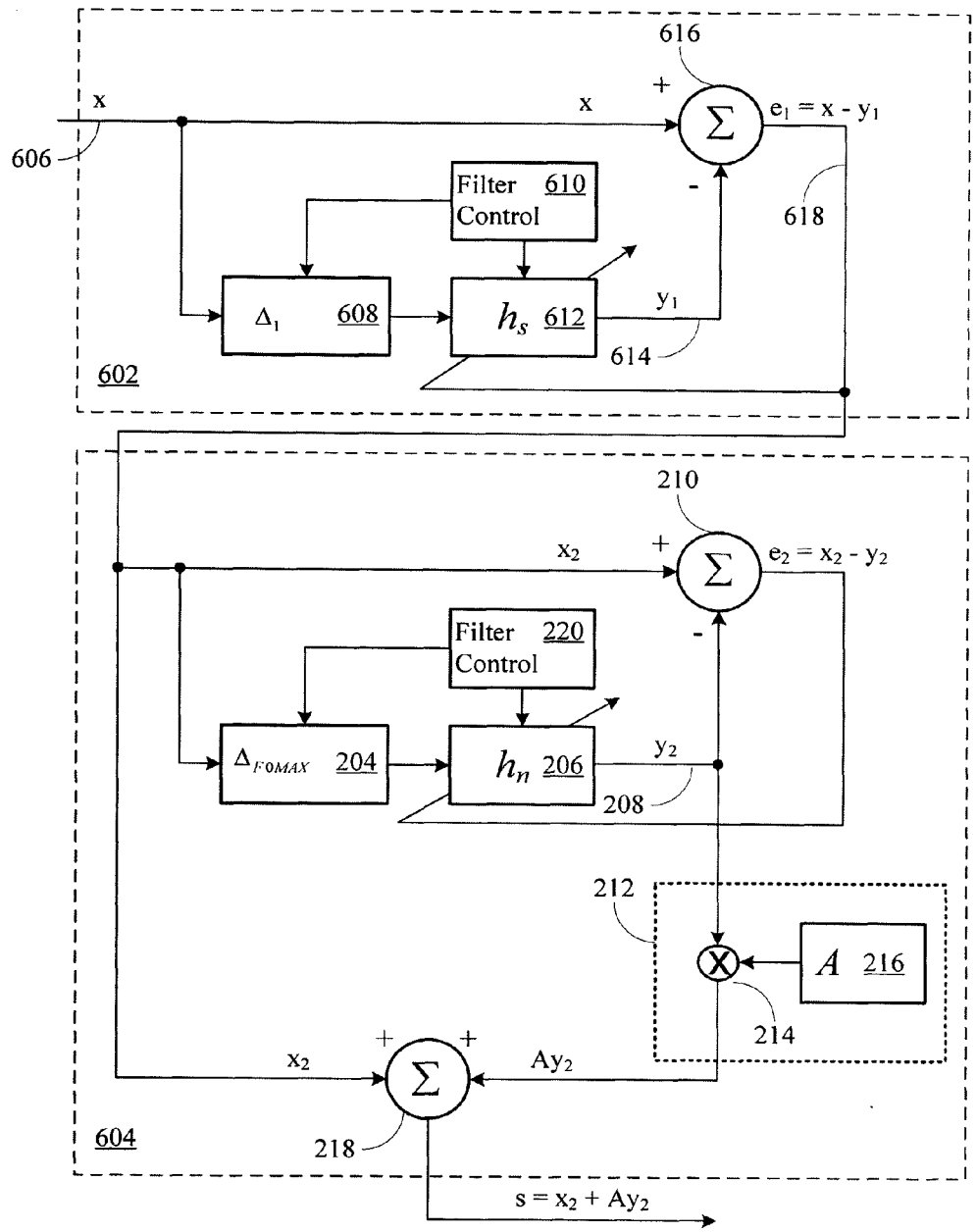
FIG. 6 is a multiple stage signal enhancement system.

FIG. 6 shows a multiple stage enhancement system 600. The enhancement system 600 may include a first filter stage 602 and a second filter stage 604. The filter stages 602 and 604 may respond or adapt at different rates. The first filter stage 602 may adapt slowly and may suppress quasi-stationary signal components. The quasi-stationary signal components may be present in the input signal because of relatively consistent background noise, such as engine noise or environmental effects, or for other reasons.

A signal input 606 may connect to the first stage 602. The signal input 606 may connect to the delay logic 608. The delay logic may implement a delay that corresponds to the period of a maximum quasi-stationary frequency that may be suppressed by the first stage 602.

The maximum quasi-stationary frequency may be selected according to detected or expected characteristics of the environment in which the enhancement system 600 is used. The filter control logic 610 may dynamically modify the delay to adapt the first stage 602 to the environment. The filter control logic 610 also may control the quasi-stationary filter 612.

The filter 612 in the first stage may include signal component tracking logic such as an NLMS adapted FIR filter or RLS adapted FIR filter. The filter 612 in the first stage may adapt slowly, for example with a sampling rate of about 8 kHz, a filter length of about 64, and an NLMS step size larger than about zero and less than approximately 0.01. This may allow attenuation of quasi-stationary periodic signals while minimally degrading typical speech signals. The first stage filtered output 614 may provide a filtered output signal that approximately reproduces the quasi-stationary signal component in the input signal.

The suppression logic 616 and slow filter adaptation may allow non-stationary signal components to pass through the first stage 602 to the second stage 604. On the other hand, the suppression logic 616 may suppress quasi-stationary signal components in the input signal. The suppression logic 616 may be implemented as arithmetic logic that subtracts the filtered output signal from the input signal.

The replicated quasi-stationary signal content in the filtered output signal may be removed from the input signal. The output signal produced by the first stage 602 may be shown by the equation below:

$$x_2 = e_1 = x - y_1,$$

where $e_1$ is the first stage output signal, x is the input signal, and $y_1$ is the first stage filtered output. The first stage output 618 may be connected to the second stage 604. The second stage 604 may process the signal $x_2$ with the adaptive filter 206. The filter 206 may adapt quickly, for example with a sampling rate of about 8 kHz, a filter length of about 64, and an NLMS step size larger than approximately 0.6 and less than about 1.0. This may allow the adaptive filter 206 to track the fundamental frequencies in typical speech signals.

The second stage 604 may enhance non-stationary signal components in the first stage output signal. The non-stationary signal components may be present in the input signal as a result of speech, music, or other signal sources. The second stage 604 may process the first stage output signal as described above.

The enhancement system 600 may employ a first suppression stage 602 followed by a second enhancement stage 604. The enhancement system 600 may to reinforce non-stationary signal content, such as voice content. In environments that introduce slowly changing signal components, the enhancement system 600 may remove or suppress the slowly changing signal components. In a wireless phone, for example, the first stage 602 may remove or suppress engine noise, road noise, or other noises, while the second stage 604 enhances non-stationary signal components, such as male or female voice components.

The signal enhancement system 100 may enhance periodic signal content, increase SNR, and/or decrease noise in an input signal. When applied to a voice signal, the enhancement system 100 may reinforce fundamental speech frequencies and may strengthen vowel or other sounds. The enhancement system 100 may enhance other signals, whether they are audible or inaudible.

The overall delay introduced by the delay logic 204 or 608 and the filter 206 or 612 also may be approximately an integer number (one or greater) of cycles of the tracked pitch period. Delaying by additional cycles may allow the input signal to change to a greater degree than waiting for one cycle. Adding a longer delayed filtered signal to the current input signal may produce special effects in the output signal, such as reverberation, while enhancing fundamental frequency components.

Figure 7:
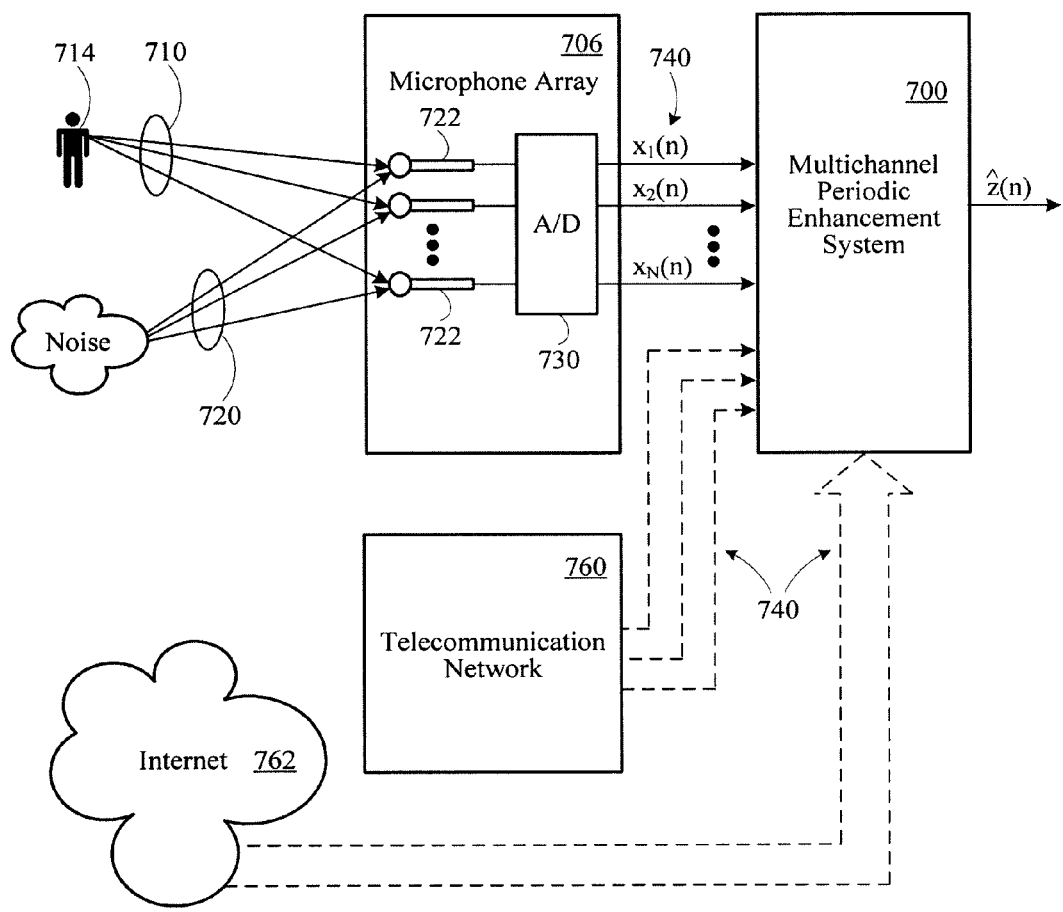
FIG. 7 is a multi-channel periodic signal enhancement system.

The periodic enhancement system of FIG. 2 may be applied to a multi-channel system. FIG. 7 shows a multi-channel periodic signal enhancement system 700. A microphone array 706 may receive a plurality of speech signals 710 produced by a speaker 714. The microphone array 706 may also receive noise signals 720. The microphone array 706 may include more than three microphones 722 or fewer than three microphones. The speech signals 710, and noise signals 720 if present, may be digitized by an analog-to-digital (A/D) converter 730. The A/D converter 730 may be part of the microphone array 706 or may be separate from the microphone array. The A/D converter 730 may digitize analog outputs of the microphone array 706 to generate digitized audio signals 740, referred to as $x_1(n) \ldots x_N(n)$.

The multi-channel periodic signal enhancement system 700 may receive the plurality of digitized audio signals $x_1(n) \ldots x_N(n)$ and may enhance signals of any frequency range, whether audible or not. The multi-channel periodic enhancement system 700 may receive the digitized audio signals $x_1(n) \ldots x_N(n)$ from different sources, such as from a telecommunications network 760, the Internet 762, or other sources.

Figure 8:
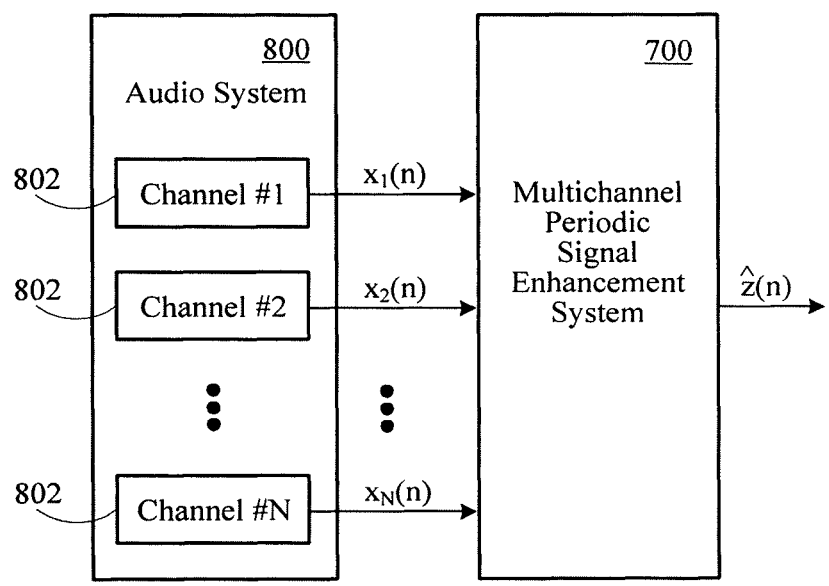
FIG. 8 is a multi-channel periodic signal enhancement system.

FIG. 8 shows an audio system 800 having three channels 802. The audio system 800 may provide the digitized audio signals $x_1(n) \ldots x_N(n)$ to the multi-channel periodic enhancement system 700. The audio system 800 may include more than three channels 802 or fewer than three channels depending on the system. The subscript N may denote the number of channels. The digitized audio signals $x_1(n) \ldots x_N(n)$ may represent time domain samples of speech, noise, audio signals, or other signals.

Figure 9:
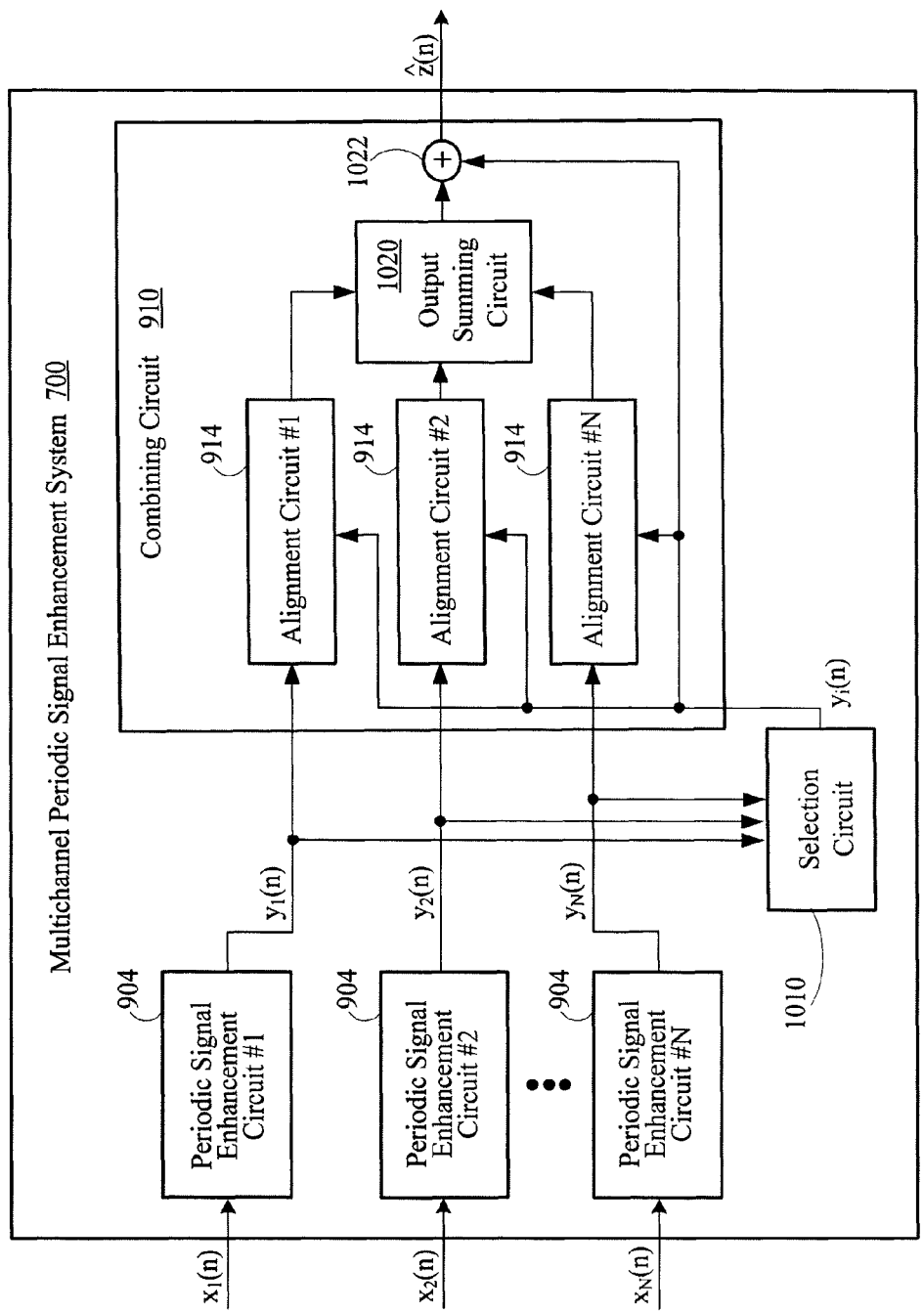
FIG. 9 shows multiple periodic signal enhancement circuits.

FIG. 9 is the multi-channel periodic enhancement system 700 including a plurality of periodic signal enhancement circuits 904. Each periodic signal enhancement circuit 904 may receive the corresponding digitized audio signals $x_1(n) \ldots x_N(n)$. Each periodic signal enhancement circuit 904 may be the same as or similar to the periodic signal enhancement system 100 of FIG. 2, and may generate a corresponding enhanced channel output signal $y_1(n) \ldots y_N(n)$. Each enhanced channel output signal $y_1(n) \ldots y_N(n)$ may have a higher signal-to-noise ratio (SNR) than the corresponding digitized audio signal $x_1(n) \ldots x_N(n)$. A combiner circuit 910 may receive the enhanced channel output signals $y_1(n) \ldots y_N(n)$ and combine and process the signals. The combiner circuit 910 may include a plurality of channel alignment circuits 914. Three alignment circuits 914 are shown, but more than three or fewer than three alignment circuits may be included depending on the system. The multi-channel periodic enhancement system 700 may include one periodic signal enhancement circuit 904 and one alignment circuit 914 for each signal channel.

Figure 10:
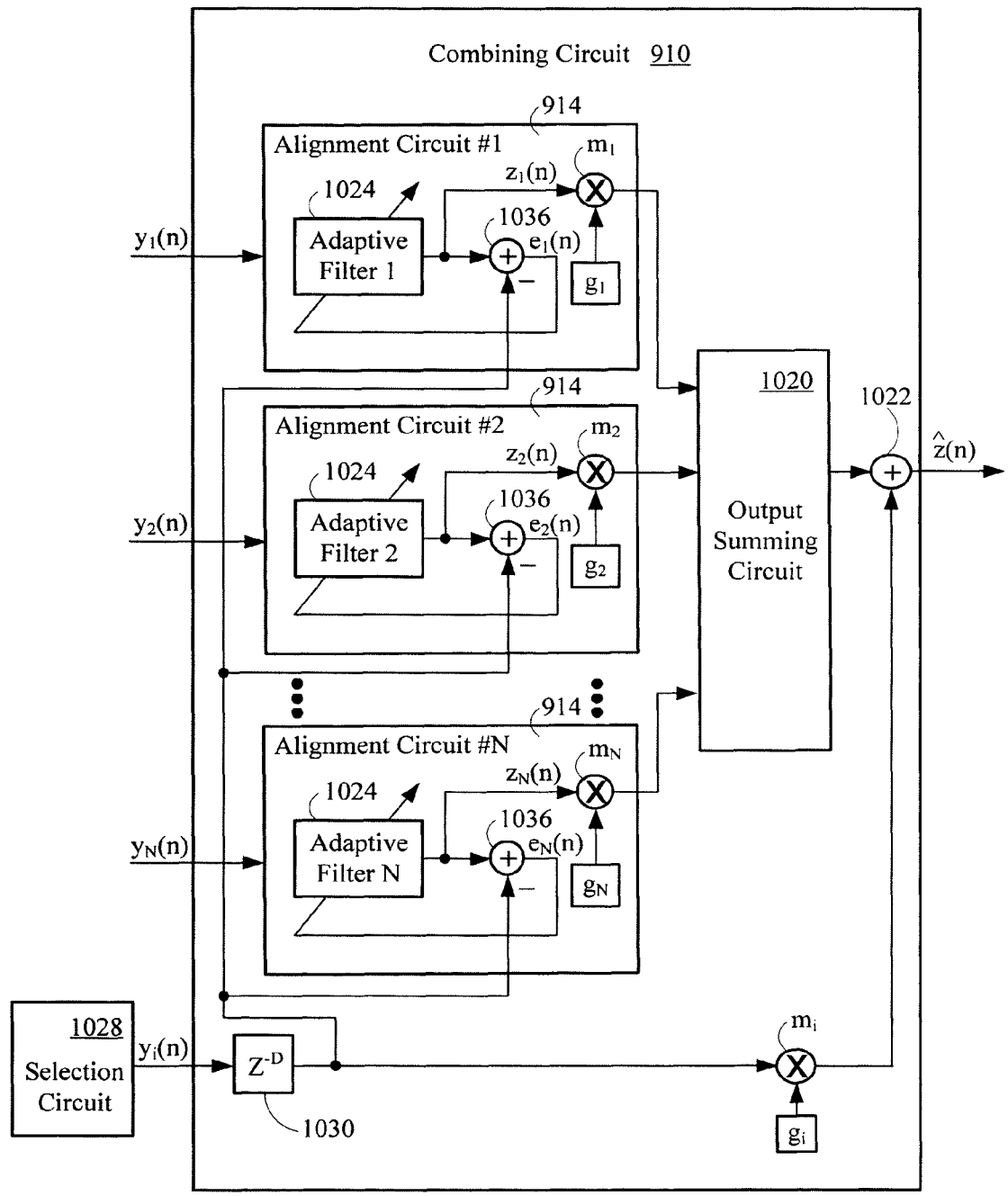
FIG. 10 is a combiner circuit.

FIG. 10 is the combiner circuit 910. The combiner circuit 910 may include the three alignment circuits 914. Each alignment circuit 914 may receive and process the corresponding enhanced channel output signal $y_1(n) \ldots y_N(n)$ that may be preprocessed by the corresponding periodic signal enhancement circuit 904. An output summing circuit 1020 may combine the output of the alignment circuits 914 to generate an enhanced combined output signal $\hat{z}(n)$ via a final adder circuit 1022. The enhanced combined output signal $\hat{z}(n)$ may have a higher SNR than any single enhanced channel output signal $y_1(n) \ldots y_N(n)$. Each alignment circuit 914 may include an adaptive filter 1024, such as a finite impulse response or digital signal processor.

The alignment circuits 914 may align the enhanced channel output signals $y_1(n) \ldots y_N(n)$ in time. When a microphone array 706 is used, the enhanced channel output signals $y_1(n) \ldots y_N(n)$ may require time-alignment because the distance from the speaker 714 to each microphone 722 of the microphone array 706 may be different. Thus, each microphone 722 may receive the speech signal 710 from the speaker 714 at a different time, and the digitized audio signals $x_1(n) \ldots x_N(n)$ and the corresponding enhanced channel output signals $y_1(n) \ldots y_N(n)$ may appear uncorrelated. When the enhanced channel output signals $y_1(n) \ldots y_N(n)$ are time-aligned and added by the output summing circuit 1020, the SNR may increase because the signals may constructively add. The enhanced channel output signals $y_1(n) \ldots y_N(n)$ signals may constructively add when time-aligned because the source signals (the speech signals 710) were correlated when generated. The speech signals 710 may be correlated because they originated from a common source, namely the speaker 714.

In contrast, the noise component 720 received by the microphone array 706, which may be included in the digitized audio signals $x_1(n) \ldots x_N(n)$, may not constructively add because the noise component 720 may not be correlated with the speech signals 710. The noise component 720 may not originate from the speaker 714, thus may not be correlated with the speech signals 710. The noise component 720 may be generated by wind, blowers, machines, mechanical devices, and other sources.

The alignment circuits 914 may align the phase of each enhanced channel output signal $y_1(n) \ldots y_N(n)$. A selection circuit 1028 may compare each of the enhanced channel output signals $y_1(n) \ldots y_N(n)$ and select a common or desired signal $y_i(n)$. The selection circuit 1028 may be included within the combiner circuit 910 or may be external to the combiner circuit. The selection circuit 1028 may select a signal with the highest SNR as a desired signal $y_i(n)$. In systems using directional microphones, the desired signal $y_i(n)$ may be selected based on a microphone oriented at a particular direction having the highest SNR. For example, in a vehicle, the microphone closest to the driver or directed toward the driver may be selected. Other criteria may be used to designate the desired signal $y_i(n)$ depending on the system.

Figure 11:
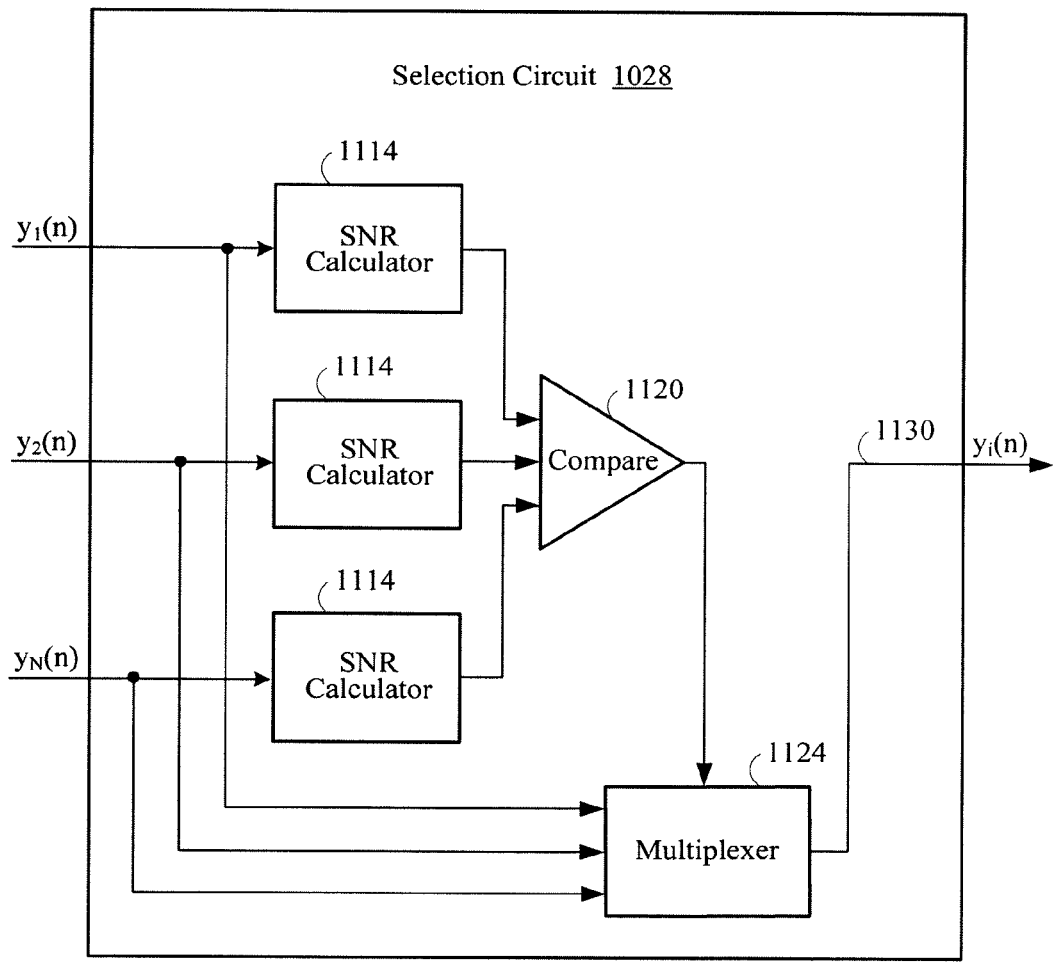
FIG. 11 is a selection circuit.

FIG. 11 is the selection circuit 1028. The selection circuit 1028 may include a plurality of SNR calculator circuits 1114, one circuit corresponding to each enhanced channel output signal $y_1(n) \ldots y_N(n)$. The SNR calculation circuit 1114 may determine the SNR, and may output a value representing the SNR. A comparator 1120 may receive and compare the SNR values to determine the highest SNR. The comparator 1120 may control a digital multiplexer 1124 to switch the enhanced channel output signal $y_1(n) \ldots y_N(n)$ with the highest SNR to an output of the selection circuit 1130. The output of the selection circuit 1130 may provide the common or desired signal $y_i(n)$.

Each of the alignment circuits 914 of FIG. 10 may receive the corresponding enhanced channel output signal $y_1(n) \ldots y_N(n)$ and the desired signal $y_i(n)$. A delay circuit 1030 may delay the desired signal $y_i(n)$ by a predetermined amount. The delay may be equal to about one-half of the length of the adaptive filter 1024. The delay may be selected so that the peak of the respective enhanced channel output signals $y_1(n) \ldots y_N(n)$ is about in the middle of the adaptive filter 1024 with respect to the number of filter coefficients. The number of taps or filter coefficients in each of the adaptive filters 1024 may be based on the relative time delay between enhanced channel output signals $y_1(n) \ldots y_N(n)$. A time delay may exist among the enhanced channel output signals $y_1(n) \ldots y_N(n)$ because there may be a difference in the distance from the speaker 714 to the closest microphone 722 and the speaker to the farthest microphone of the microphone array 706. Each adaptive filter 1024 may have about between about 10-40 taps in a system where the difference between the speaker 714 and closest microphone and the speaker and the farthest microphone is about three inches.

The adaptive filter 1024 may process the respective enhanced channel output signal $y_1(n) \ldots y_N(n)$ to time-align each channel with the common or desired signal $y_i(n)$. The adaptive filters 1024 may generate respective time-aligned output signals $z_1(n) \ldots z_N(n)$. Corresponding error summing circuits 1036 may sum the respective time-aligned output signals $z_1(n) \ldots z_N(n)$ and the delayed desired signal $y_i(n)$ to generate corresponding error signals $e_1(n) \ldots e_N(n)$. The adaptive filter 1024 may minimize the respective error signals $e_1(n) \ldots e_N(n)$ based on a least-squares type of process. The adaptive filters 1024 may use other circuitry configured to execute recursive least-squares, normalized least mean squares, proportional least mean squares, and/or least mean square routines. Other circuits may be used to minimize the respective error signals $e_1(n) \ldots e_N(n)$. Further variations of the minimization process may be used to ensure that the output of the adaptive filters 1024 does not diverge.

Each alignment circuit 914 may include a corresponding multiplier circuit $m_1 \ldots m_N$ that may multiply the time-aligned output signals $z_1(n) \ldots z_N(n)$ by a corresponding gain factor $g_1(n) \ldots g_N(n)$. The gain factor $g_1(n) \ldots g_N(n)$ may provide a gain factor of between about zero and 1, and may scale the magnitude of the respective time-aligned output signal $z_1(n) \ldots z_N(n)$ prior to summing by the output summing circuit 1020. Each time-aligned output signal $z_1(n) \ldots$ $z_N(n)$ may have a different associated SNR. A low gain factor $g_1(n) \ldots g_N(n)$ may be applied to a time-aligned output signal $z_1(n) \ldots z_N(n)$ having a high SNR to minimize its contribution. A high gain factor $g_1(n) \ldots g_N(n)$ may be applied to a time-aligned output signal $z_1(n) \ldots z_N(n)$ having a low SNR to maximize its contribution. In some systems, the gain factors $g_1(n) \ldots g_N(n)$ may extended into sub-bands by dividing the output of each adaptive filter into sub-bands with an independent gain factor for each sub-band.

The delayed desired signal $y_i(n)$ may be scaled by a multiplier circuit $m_i$ having a gain factor $g_i(n)$. The final adder circuit 1022 may add the output of the output summing circuit 1020 to the output of the multiplier circuit $m_i$ to generate the combined output signal $\hat{z}(n)$. The sum of all of the gain factors $g_1(n) \ldots g_N(n)$ and $g_i(n)$ may have a maximum value of about 1. The gain factors $g_1(n) \ldots g_N(n)$ and $g_i(n)$ may provide flexibility when the time-aligned output signals $z_1(n) \ldots z_N(n)$ are combined to meet criteria or cost functions. In some systems, the background noise in each of the channels may be adjusted to the same level before combining. In other systems, speech signals originating from certain directions may be suppressed.

Figure 12:
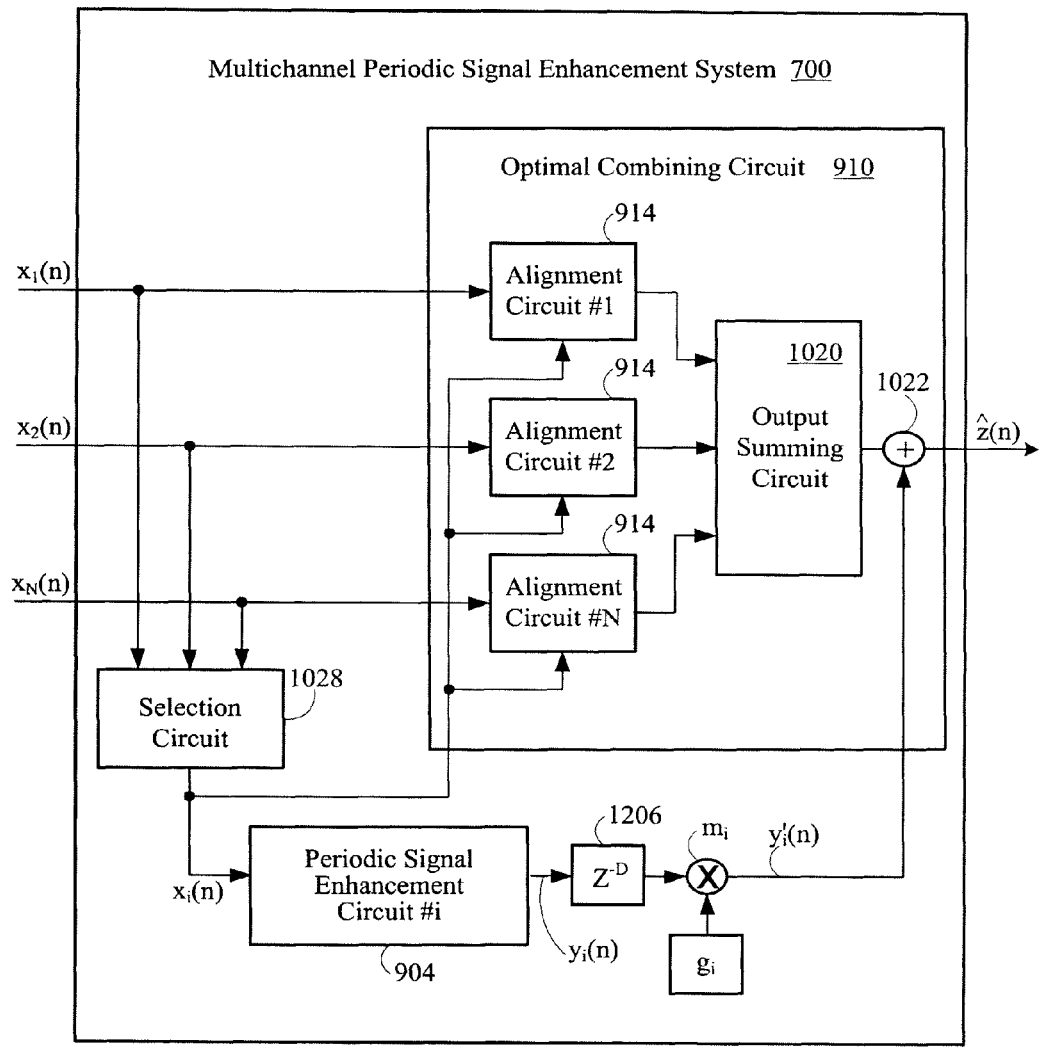

FIG. 12 is a multi-channel periodic enhancement system 1200. The multi-channel periodic enhancement system 1200 may be similar to the multi-channel signal enhancement system 700 of FIG. 9. A periodic signal enhancement circuit 904 may be applied to a selected digitized audio signal $x_i(n)$. The alignment circuits 914, the output summing circuit 1020, the final adder circuit 1022, the selection circuit 1028, and the periodic enhancement circuits 904 of FIG. 12 may be similar to or the same as the corresponding components in FIG. 9. The multi-channel periodic enhancement system 1200 may have reduced computational requirements because the periodic signal enhancement circuit 904 may be applied only to a desired signal $y_i(n)$, thus reducing the computational load.

The selection circuit 1028 may compare each of the digitized audio signals $x_1(n) \ldots x_N(n)$ and select a desired audio signal $x_i(n)$. The selection circuit 1028 may be included in the combiner circuit 910 or may be external to the combiner circuit 910. The selection circuit 1028 may select the signal with the highest SNR as a desired signal $x_i(n)$. The periodic signal enhancement circuit 904 may process the desired signal $x_i(n)$ to generate an enhanced desired signal $y_i(n)$.

A delay circuit 1206 may delay the enhanced desired signal $y_i(n)$ by a predetermined amount. A multiplier circuit $m_i$ may scale the output of the delay circuit 1206 by a gain factor $g_i$ to generate a delayed enhanced desired signal $y'_i(n)$. The delay may be equal to about one-half of the length of the adaptive filter included in each of the alignment circuits 914. Each alignment circuit 914 may time-align the respective digitized audio signals $x_1(n) \ldots x_N(n)$ with the delayed enhanced desired signal $y'_i(n)$.

The output summing circuit 1020 may sum the time-aligned signals generated by the alignment circuits 914. The final adding circuit 1022 may add the output of the output summing circuit 1020 to the delayed enhanced desired signal $y'_i(n)$ to generate the combined output signal $\hat{z}(n)$.

Figure 13:
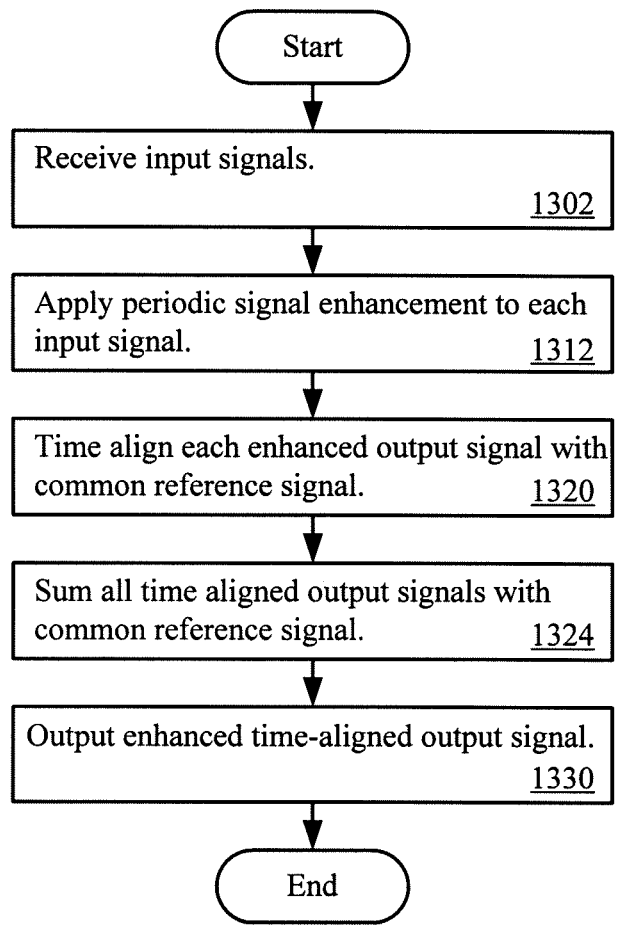
FIG. 13 is a flow diagram for multi-channel periodic signal enhancement.

FIG. 13 is a process (Act 1300) for multi-channel periodic signal enhancement. The process may be implemented with components shown in FIGS. 9-12. The multi-channel periodic enhancement system may receive a plurality of input signals from an audio source device (Act 1302). Each of the input signals may be enhanced by the periodic signal enhancement circuit 904 to generate respective enhanced output signals (Act 1312). Each of the enhanced output signals may be aligned in time with a common reference signal to generate respective time-aligned output signals (Act 1320). The common reference signal may be based on an enhanced output signal having a highest signal-to-noise ratio. The output summing circuit 1020 may sum the respective time-aligned output signals and the common reference signal (Act 1324), to generate an enhanced time-aligned output signal (Act 1330).

The periodic signal enhancement circuits 904 and the alignment circuits 914 may be implemented in hardware, software, or a combination of hardware and software. The periodic signal enhancement circuits and the alignment circuits may take the form of instructions stored on a machine-readable medium such as a disk, flash card, or other memory. The periodic signal enhancement circuits and alignment circuits may be incorporated into communication devices, sound systems, gaming devices, signal processing software, or other devices and programs.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A signal enhancement system having an audio source device configured to generate a plurality of input signals from a common source, the system comprising:
   a plurality of periodic signal enhancement circuits implemented in hardware or executed by a processor, each periodic signal enhancement circuit comprising an adaptive filter and each periodic signal enhancement circuit configured to:
   receive the respective input signal;
   add a first periodic signal component in the input signal with a second periodic signal component in an output of the adaptive filter to increase the first periodic signal component in the input signal, the second periodic signal component being at least partially in-phase with the first periodic signal component; and
   generate an enhanced output signal, the enhanced output signal comprising the increased first periodic signal component;
   a plurality of alignment circuits, each configured to receive the respective enhanced output signal and a common reference signal;
   the respective alignment circuit time-aligning each enhanced output signal with the common reference signal to generate a time-aligned output signal; and
   a summing circuit configured to:
   add the respective time-aligned output signals and the common reference signal to generate an enhanced time-aligned output signal; and
   output the enhanced time-aligned output signal.

2. The system according to claim 1, where the common reference signal is selected from the respective enhanced output signals having a highest signal-to-noise ratio.

3. The system according to claim 1, where the plurality of input signals are generated by a common audio source and contain correlated signal components.

4. The system according to claim 1, where the audio source device comprises a microphone array.

5. The system according to claim 1, where the audio source device is selected from the group consisting of a microphone array, a directional microphone array, a plurality of directional microphones, a telecommunications network, or the Internet.

6. The system according to claim 1, where each alignment circuit includes an adaptive filter circuit having a plurality of coefficients.

7. The system according to claim 6, further comprising a multiplier circuit in each alignment circuit configured to scale an output of the adaptive filter circuit by a weighting factor.

8. The system according to claim 7, where a sum of the weighing factors is between about zero and about one.

9. The system according to claim 6, further comprising a delay circuit configured to delay the common reference signal so that the coefficients of the adaptive filter circuit peak at about a mid-point in the respective adaptive filter circuit.

10. The system according to claim 1, further comprising:
a selection circuit configured to calculate a signal-to-noise ratio for each enhanced output signal;
a comparison circuit configured to compare the calculated signal-to-noise ratio; and a path selection circuit configured to select the enhanced output signal having a highest signal-to-noise ratio, and output the selected signal as the common reference signal.

11. The system according to claim 1, where each periodic signal enhancement circuit includes a reinforcement logic circuit.

12. The system according to claim 1, where respective alignment circuits apply a least-squares logic to time-align the enhanced output signal with the common reference signal.

13. The system according to claim 12, where the least-squares logic is selected from the group consisting of recursive least-squares, normalized least mean squares, proportional least mean squares, or least mean squares.

14. A signal enhancement system comprising:
an audio source device configured to generate a plurality of input signals from a common source, the input signals having correlated signal components;
a plurality of periodic signal enhancement circuits implemented in hardware or executed by a processor, each periodic signal enhancement circuit comprising an adaptive filter and each periodic signal enhancement circuit configured to:
receive the respective input signal;
add a first periodic signal component in the input signal with a second periodic signal component in an output of the adaptive filter to increase the first periodic signal component in the input signal, the second periodic signal component being at least partially in-phase with the first periodic signal component; and
generate an enhanced output signal, the enhanced output signal comprising the increased first periodic signal component;
a selection circuit configured to calculate a signal-to-noise ratio for each enhanced output signal and select an enhanced output signal having a highest signal-to-noise ratio as a common reference signal;
a plurality of alignment circuits, each configured to receive the respective enhanced output signal and the common reference signal;
the respective alignment circuit time-aligning each enhanced output signal with the common reference signal to generate a time-aligned output signal; and
a summing circuit configured to:
add the respective time-aligned output signals and the common reference signal to generate an enhanced time-aligned output signal; and
output the enhanced time-aligned output signal.

15. A signal enhancement system having an audio source device configured to generate a plurality of input signals from a common source, the system comprising:

a selection circuit configured to calculate a signal-to-noise ratio for each input signal and select an input signal having a highest signal-to-noise ratio as a common reference signal;
a periodic signal enhancement circuit implemented in hardware or executed by a processor, the periodic enhancement circuit comprising an adaptive filter and the periodic signal enhancement circuit configured to:
receive the common reference signal;
add a first periodic signal component in the common reference signal with a second periodic signal component in an output of the adaptive filter to increase the first periodic signal component in the common reference signal, the second periodic signal component being at least partially in-phase with the first periodic signal component; and
generate an enhanced common reference signal, the enhanced common reference signal comprising the increased first periodic signal component;
a plurality of alignment circuits, each configured to receive the respective input signal and the enhanced common reference signal, the respective alignment circuit time-aligning each input signal with the enhanced common reference signal to generate a time-aligned output signal; and
a summing circuit configured to:
add the respective time-aligned output signals and the enhanced common reference signal to generate an enhanced time-aligned output signal; and
output the enhanced time-aligned output signal.

16. A method for enhancing a signal, comprising:
receiving a plurality of input signals from an audio source device;
enhancing each of the input signals to generate respective enhanced output signals, where for each of the input signals, enhancing the input signal comprises: adding a first periodic signal component in the input signal with a second periodic signal component in an output of the adaptive filter to increase the first periodic signal component in the input signal, the second periodic signal component being at least partially in-phase with the first periodic signal component, the enhanced output signal comprising the increased first periodic signal component;
aligning in time each of the enhanced output signals with a common reference signal to generate respective time-aligned output signals, the common reference signal based on an enhanced output signal having a highest signal-to-noise ratio; and
summing the respective time-aligned output signals and the common reference signal to generate an enhanced time-aligned output signal.

17. The method according to claim 16 further comprising generating the plurality of input signals by a common audio source, the input signals containing correlated signal components.

18. The method according to claim 16, further comprising providing the plurality of input signals using an array of transducers.

19. The method according to claim 16, further comprising adaptively filtering the respective enhanced output signals to time-align the respective enhanced output signal with the common reference signal.

20. The method according to claim 19, further comprising multiplying respective results of the adaptive filtering by a respective weighting factor.

21. The method according to claim 20, where a sum of the respective weighting factors is between about zero and about one.

22. The method according to claim 16, further comprising:
calculating an signal-to-noise ratio for each enhanced output signal;
comparing the calculated signal-to-noise ratio;
selecting an enhanced output signal having the highest signal-to-noise ratio; and
outputting the selected signal as the common reference signal.

23. The method according to claim 16, where enhancing each of the input signals comprises reinforcing signal components of the respective input signals.

24. The method according to claim 16, further comprising processing the respective enhanced output signals using a least-squares process to time-align the enhanced output signal with the common reference signal.

25. A non-transitory computer-readable storage medium comprising processor-executable instructions to enhance a multi-channel signal configured to:
receive a plurality of input signals from an audio source device;
enhance each of the input signals to generate respective enhanced output signals by adding a first periodic signal component in the input signal with a second periodic signal component in an output of the adaptive filter to increase the first periodic signal component in the input signal, the second periodic signal being at least partially in-phase with the second periodic signal component, each of the enhanced output signals comprising the increased first periodic signal component;
align in time each of the enhanced output signals with a common reference signal to generate respective time-aligned output signals, the common reference signal based on an enhanced output signal having a highest signal-to-noise ratio; and
sum the respective time-aligned output signals and the common reference signal to generate an enhanced time-aligned output signal.

* * * * *